United States Patent [19]

Gutierrez et al.

[11] 3,972,750

[45] Aug. 3, 1976

[54] ELECTRON EMITTER AND METHOD OF FABRICATION

[75] Inventors: William A. Gutierrez; Herbert L. Wilson, both of Woodbridge, Va.

[73] Assignee: The United States of America as represented by the Secretary of the Army, Washington, D.C.

[22] Filed: Apr. 30, 1975

[21] Appl. No.: 573,289

[52] U.S. Cl. .............................. 148/171; 148/172; 148/175; 148/1.5; 252/62.3 GA; 357/29; 313/95; 156/17
[51] Int. Cl.² .......................................... H01L 21/20
[58] Field of Search ............... 148/171, 172, 33.5, 148/175, 105; 252/62.3 GA; 357/29; 313/95; 156/17

[56] References Cited
UNITED STATES PATENTS

| | | |
|---|---|---|
| 3,478,213 | 11/1969 | Simon et al. .................. 313/95 X |
| 3,672,992 | 6/1972 | Schaefer ...................... 148/171 X |
| 3,762,968 | 10/1973 | Kressel et al. ................ 148/171 |
| 3,862,859 | 1/1975 | Ettenberg et al. ............. 148/175 X |
| 3,901,744 | 8/1975 | Bolger et al. ................. 148/171 |
| 3,901,745 | 8/1975 | Pion ............................ 148/171 |
| 3,914,136 | 10/1975 | Kressel ........................ 148/171 |

*Primary Examiner*—G. Ozaki
*Attorney, Agent, or Firm*—Nathan Edelberg; Milton W. Lee; Robert P. Gibson

[57] ABSTRACT

Transmission mode negative electron affinity gallium arsenide (GaAs) photocathodes and dynodes with a technique for the fabrication thereof, utilizing multilayers of GaAs and gallium aluminum arsenide (GaAlAs) wherein the GaAs layers serve as the emitting layer and as intermediate construction layers and the GaAlAs layer serves as a passivating window.

10 Claims, 9 Drawing Figures

STEP 1 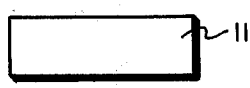
STEP 7 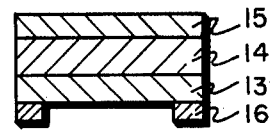
STEP 2 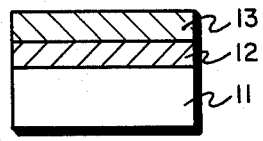
STEP 8 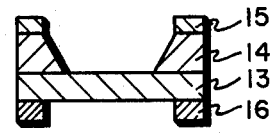
STEP 3 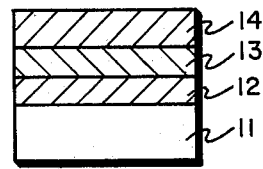
STEP 4 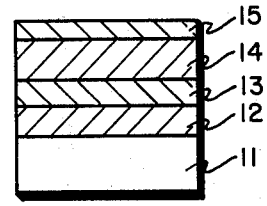
STEP 9 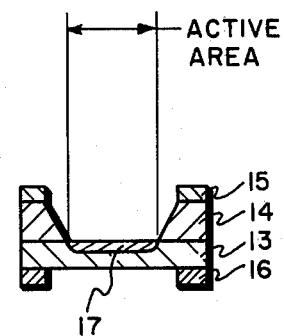
STEP 5 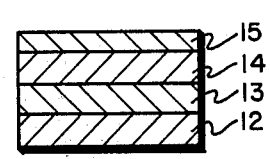
STEP 6 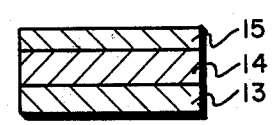

ELECTRON EMITTER AND METHOD OF FABRICATION

The invention described herein may be manufactured, used, and licensed by or for the Government for governmental purposes without the payment to us of any royalty thereon.

BACKGROUND OF INVENTION

This invention disclosure relates to electron emitters and more specifically to transmission mode negative electron affinity photocathodes and dynodes (secondary emissive devices). Photocathodes convert impinging radiation into a corresponding electron image whereas secondary emissive devices provide electron multiplication. Due primarily to the fragile nature of transmission mode negative electron affinity photocathodes and dynodes and the difficulty encountered in the fabrication thereof, commercial applicability and acceptability has been slow in materializing.

Electron emitting components, based on the negative electron affinity effect in cesium-oxygen treated single crystal semiconductor surfaces, have significantly better performance than conventional emitters in terms of sensitivity and resolution primarily due to their longer escape depths, higher escape probabilities, and narrower exit energy distributions. For a large number of pick-up tube applications (i.e., photomultipliers, television camera tubes, image intensifiers, etc.) transmission mode operation is required because this mode of operation greatly simplifies both the light and electron optics, thereby resulting in smaller and less expensive tubes.

SUMMARY OF THE INVENTION

This invention relates to a method of constructing high performance transmission mode GaAs photocathodes and dynodes wherein GaAlAs is used as a passivating window support layer and GaAs is used in successive multiple layers as a seed crystal support layer, an etch-stop layer and an electron emitting layer. The advantage of using GaAlAs in the construction of GaAs electron emitters lies in the fact that the lattice parameter and thermal expansion coefficient of the two materials match very closely. In multilayer structures, such as those described in this invention, this matched condition reduces the dislocations and strains in the bulk of the layers as well as at their interfaces, leading to improved crystalline quality and enhanced device performance. In addition, the difference in the etching behavior, optical transmission, and energy bandgap between GaAs and GaAlAs enables preferential etching and passivation to be performed, thus significantly facilitating device construction.

IN THE DRAWING

The single FIGURE shows the several steps envisioned in alternatively fabricating a photocathode and dynode with steps 1 through 7, inclusive, disclosing one procedure for fabricating a photocathode and steps 8 and 9 disclosing a further refinement of the process resulting in a wide band photocathode and dynode.

DETAILED DESCRIPTION

The various steps in the fabrication of a transmission mode photocathode and of a dynode as envisioned herein can best be understood by reference to the drawing wherein like reference characters designate like or corresponding layers of material throughout the several views.

The following procedure describes a method for constructing a high sensitivity high resolution GaAs transmission mode photocathode. With a few additional processing steps, an improved transmission mode dynode can be constructed which will function as a broadband transmissive photocathode, as well as a secondary emissive device. The fabrication process is described with the aid of the single FIGURE.

In step 1 a (100) oriented p-doped GaAs seed crystal 11 approximately 15 mils thick and 18–25 mm in diameter, is prepared for epitaxial growth by chemically polishing the growth surface in a $5H_2SO_4:1H_2O_2:1H_2O$ etch to remove any residual mechanical damage introduced by previous mechanical lapping and polishing steps. In step 2 a n-doped ($2 \times 10^{17}$ cm$^{-3}$) GaAs etch stop layer 12 is epitaxially grown on layer 11 to a thickness of about 2 microns. A GaAs electron emitting layer 13 is then epitaxially grown on layer 12 to a thickness of approximately 1–2 microns with a p-type doping concentration of about $5 \times 10^{18}$cm$^{-3}$. The growth of layers 12 and 13 is best carried out by the open tube vapor phase method using a HCl-Ga-AsH$_3$-H$_2$ process and selenium and zinc for the n and p-type dopants respectively. Although the preferred method for growing layers 12 and 13 is the vapor method, it is clear that these layers can also be grown by liquid phase techniques using a number of conventional methods (i.e., dipping, tipping, or sliding). In step 3 a Ga$_x$Al$_{1-x}$As ($0.3 \leq x \leq 0.7$) passivating window layer 14 lightly p-doped not to exceed a carrier concentraion of $5 \times 10^{17}$cm$^{-3}$, is grown on layer 13 to a thickness greater than 100 microns by either liquid phase epitaxy or open tube vapor phase epitaxy using trimethylgallium and trimethlaluminum as the group III element sources and arsine as the arsenic source. In step 4 a suitable antireflection coating 15 (i.e., silicon dioxide, silicon nitride, or multilayer composite) is applied to a thickness of approximately 1000 Angstroms onto layer 14 to minimize the incident radiation reflection loss. The antireflection layer may be applied by any well known methods, such as by chemical vapor deposition, RF sputtering or vacuum evaporation. In the case where layer 14 is not grown smooth, it can be polished to produce a planar specular surface prior to the application of the antireflective coating 15 to insure the maximum possible resolution from the photocathode when used in an imaging device. In step 5 the seed crystal is completely removed by electrochemically etching away layer 11 from layer 12 in a 0.2M KOH solution. This electrochemical process preferentially removes p-type from lightly doped n-type GaAs. Both seed crystal 11 and etch stop layer 12 are used for construction purposes only and are not intended to be an integral part of the finished device. During the fabrication process seed crystal 11 is necessary for providing strength as a substrate support upon which the other layers of the device are grown, while layer 12 is very thin and provides an etch-stop layer for protecting the GaAs layer 13 from chemical damage during the etch removal of substrate 11. Since the sole purpose of the etch-stop layer 12 is to protect layer 13 during removal of layer 11, then the etch-stop layer 12 will serve no further purpose and must also be removed. In step 6 the thin n-type stop layer 12 is chemically etched off in a 0.5% bromine-methanol solution exposing the layer 13 whose surface is the electron emitter. An ohmic contact ring 16 is then applied to a thickness of approximately 500 angstroms by either evaporation or sputtering to the periphery of layer 13 such that electrical connections can be made to the photocathode structure. The diagram in step 7 shows the completed photocathode structure consisting of layers 13, 14, 15 and 16, with layer 15 being the photon receiving side and layer 13 the electron emitting side.

To form a transmission mode dynode structure, layer 13 is made self-standing by preferentially etching layer 14 away from layer 13 in the desired active region while leaving a portion of layer 14 on the periphery of the structure as a ring mechanical support for the self-standing layer as shown in step 8. Layer 14 can be etched away from 13 in HCl which preferentially etches GaAlAs from GaAs. The insulating antireflection coating 15 can be used as a mask to define the active region using standard photolithographic techniques. Finally, to minimize the backsurface recombination velocity and improve device performance, a highly p-doped (approx. $5 \times 10^{20} cm^{-3}$) skin 17 can be ion implanted by standard techniques to a depth of 1000 angstroms into the input side of the dynode as shown in step 9. The diagram in step 9 shows the completed dynode structure, with 17 being the input side for receiving the primary electrons with the surface opposite 17 being the exit surface for the generated secondary electrons.

When a photocathode and/or dynode is constructed according to the process described above and the GaAs emitting layer is activated to a state of negative electron affinity by heat cleaning in vacuum and applying by well known techniques monolayer amounts of cesium and oxygen, both components exhibit highly improved performance over conventional photocathodes and dynodes. The dynode structure can also be used as a broadband photocathode, since it does not have the filtering characteristics of the GaAlAs window layer. When the dynode is used as photocathode, layer 17 functions as the light incident side of the device with the opposite surface becoming the electron emitting side.

It should be understood, of course, that the foregoing disclosure relates to only a preferred embodiment of the invention and that numerous modifications or alterations may be made therein without departing from the spirit and the scope of the invention as set forth in the appended claims.

We claim:

1. A method of fabricating a transmission mode gallium arsenide electron emitter comprising the steps of:
   preparing a p-doped gallium arsenide seed crystal for growth by chemically polishing the growth surface;
   epitaxially growing an etch stop layer of lightly n-doped gallium arsenide onto the prepared surface of the seed crystal;
   epitaxially growing a p-doped gallium arsenide emitter layer onto the etch stop layer;
   epitaxially growing a lightly p-doped gallium aluminum arsenide passivating window layer onto the emitter layer;
   preferentially removing the gallium arsenide seed crystal from the etch stop layer;
   preferentially removing the gallium arsenide etch stop layer from the emitter layer; and
   providing ohmic contact means for the exposed surface of the emitter layer.

2. The method of claim 1, wherein the seed crystal is selected with a thickness of approximately 15 mils, growth of the etch stop layer is held to approximately 2 microns, growth of the emitter layer is held to a range of 1–2 microns, and growth of the passivating window reaches at least 100 microns.

3. The method of claim 1 further comprising the application of an antireflection coating to the passivating window layer.

4. The method of claim 3 wherein removal of the gallium arsenide seed crystal is effected by preferential etching in a 0.2M KOH solution by electrochemical processing.

5. The method of claim 4, wherein the preferential removal of the etch stop layer of gallium aluminum arsenide is effected by etching with HCl.

6. The method of claim 3 wherein the emitter layer is made self-standing by the preferential etching away of portions of the antireflection coating and passivating layer in a desired active region while leaving a portion of the passivating layer on the periphery of the structure as a mechanical support ring for the emitter layer.

7. The method of claim 6, wherein the selective etching away of the passivating layer is effected by a concentrated HCl etch.

8. The method of claim 7, wherein backsurface recombination velocity is minimized by ion implantation in the active region to a depth of approximately 1000 angstroms.

9. The photocathode resulting from the practice of the fabrication method of claim 6.

10. The photocathode resulting from the practice of the fabrication method of claim 1.

* * * * *